(12) United States Patent
Chakrabarti et al.

(10) Patent No.: US 10,171,050 B2
(45) Date of Patent: Jan. 1, 2019

(54) CIRCUITS FOR PROVIDING CLASS-E POWER AMPLIFIERS

(71) Applicants: Anandaroop Chakrabarti, New York, NY (US); Harish Krishnaswamy, New York, NY (US)

(72) Inventors: Anandaroop Chakrabarti, New York, NY (US); Harish Krishnaswamy, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 15/250,447

(22) Filed: Aug. 29, 2016

(65) Prior Publication Data

US 2017/0194920 A1    Jul. 6, 2017

Related U.S. Application Data

(63) Continuation of application No. 14/009,854, filed as application No. PCT/US2012/032218 on Apr. 4, 2012, now Pat. No. 9,431,975.

(60) Provisional application No. 61/620,361, filed on Apr. 4, 2012, provisional application No. 61/471,645, filed on Apr. 4, 2011.

(51) Int. Cl.
*H03F 3/217* (2006.01)
*H03F 1/56* (2006.01)

(52) U.S. Cl.
CPC ............. *H03F 3/2176* (2013.01); *H03F 1/56* (2013.01); *H03F 2200/222* (2013.01); *H03F 2200/387* (2013.01); *H03F 2200/402* (2013.01)

(58) Field of Classification Search
CPC .................................. H03F 3/217; H03F 1/22
USPC ....................................... 330/251, 311, 207 A
See application file for complete search history.

(56) References Cited

U.S. PATENT DOCUMENTS

| | | | |
|---|---|---|---|
| 5,867,061 A | 2/1999 | Rabjohn et al. | |
| 6,359,513 B1 | 3/2002 | Kuo et al. | |
| 6,995,616 B2 * | 2/2006 | Behzad | H03F 1/223 |
| | | | 330/310 |
| 7,071,785 B2 | 7/2006 | Behzad | |
| 7,215,206 B2 | 5/2007 | Dupuis et al. | |

(Continued)

OTHER PUBLICATIONS

Office Action dated Feb. 28, 2017 in U.S. Appl. No. 14/639,700.

(Continued)

*Primary Examiner* — Henry Choe
(74) *Attorney, Agent, or Firm* — Byrne Poh LLP

(57) ABSTRACT

In some embodiments, circuits for providing Class-E power amplifiers are provided, the circuits comprising: a first switch having a first side and a second side; a first Class-E load network coupled to the first side of the first switch; a second Class-E load network; and a second switch having a first side and a second side, the first side of the second switch being coupled the second side of the first switch and the second Class-E load network. In some embodiments, the circuits further comprise: a third switch having a first side and a second side; a third Class-E load network coupled to the first side of the third switch; a fourth Class-E load network; and a fourth switch having a first side and a second side, the first side of the fourth switch being coupled the second side of the third switch and the fourth Class-E load network.

17 Claims, 5 Drawing Sheets

(56) References Cited

U.S. PATENT DOCUMENTS

| | | | |
|---|---|---|---|
| 7,242,245 | B2 | 7/2007 | Burns et al. |
| 7,439,802 | B2 * | 10/2008 | Tsai ........................ H03F 1/26 330/109 |
| 7,560,994 | B1 | 7/2009 | Lee et al. |
| 7,612,616 | B2 * | 11/2009 | Deng .................... H03F 1/0205 330/253 |
| 7,696,828 | B2 | 4/2010 | Chang |
| 7,714,664 | B2 * | 5/2010 | Kanaya ................. H03F 1/0261 330/296 |
| 7,728,662 | B2 | 6/2010 | Apel |
| 8,018,288 | B2 | 9/2011 | Duster et al. |
| 8,102,213 | B2 | 1/2012 | Tasic et al. |
| 8,111,104 | B2 | 2/2012 | Ahadian et al. |
| 8,368,469 | B2 | 2/2013 | Mohammadi et al. |
| 8,497,738 | B2 | 7/2013 | Guo |
| 8,620,234 | B2 | 12/2013 | Yang et al. |
| 9,118,288 | B2 | 8/2015 | Lai et al. |
| 9,413,298 | B2 | 8/2016 | Nobbe et al. |
| 9,614,541 | B2 | 4/2017 | Chakrabarti et al. |
| 2004/0085138 | A1 * | 5/2004 | Franca-Neto ........... H03F 1/223 330/311 |
| 2004/0113689 | A1 | 6/2004 | Hajimiri et al. |
| 2005/0110594 | A1 | 5/2005 | Culliton et al. |
| 2006/0261890 | A1 | 11/2006 | Floyd et al. |
| 2006/0270367 | A1 | 11/2006 | Burgener et al. |
| 2007/0075784 | A1 | 4/2007 | Pettersson et al. |
| 2008/0030489 | A1 | 2/2008 | Kim et al. |
| 2008/0036486 | A1 | 2/2008 | Gattiker et al. |
| 2010/0060353 | A1 | 3/2010 | Grebennikov et al. |
| 2012/0268205 | A1 | 10/2012 | Presti |
| 2012/0319782 | A1 | 12/2012 | Nam et al. |
| 2013/0293308 | A1 | 11/2013 | Gupta |
| 2013/0335147 | A1 | 12/2013 | Ma et al. |

OTHER PUBLICATIONS

Abbasi, M. et al., "A Broadband Differential Cascode Power Amplifier in 45 nm CMOS for High-Speed 60 GHz System-on-Chip", In IEEE Symposium on Radio Frequency Integrated Circuits (RFIC '10), May 23-25, 2010, pp. 533-536.

Acar, M. et al., "Analytical Design Equations for Class-E Power Amplifiers with Finite DC-Feed Inductance and Switch On-Resistance", In Proceedings of the International Symposium on Circuits and Systems (ISCAS '07), New Orleans, LA, US, May 27-30, 2007, pp. 2818-2821.

Acar, M. et al., "Generalized Analytical Design Equations for Variable Slope Class-E Power Amplifiers", In Proceedings of the International Conference on Electronics, Circuits, and Systems (ICECS '06), Nice-Acropolis, FR, Dec. 10-13, 2006, pp. 431-434.

Afshari, E. et al., "Electrical Funnel: A Broadband Signal Combining Method", In Proceedings of 2006 IEEE ISSCC, San Francisco, CA, US, Feb. 6-9, 2006, pp. 751-760.

Agah, A. et al., "A 34% PAE, 18.6dBm 42-45 GHz Stacked Power Amplifier in 45 nm SOI CMOS", In Proceedings of IEEE Radio Frequency Integrated Circuits Symposium, Montreal, QC, CA, Jun. 17-19, 2012, pp. 57-60.

Agah, A. et al., "A 42 to 47-GHz, 8-Bit I/Q Digital-to-RF Converter with 21-dBm PSAT and 16CMOS", In Proceedings of IEEE Radio Frequency Integrated Circuits Symposium, Honolulu, HI, US, Jun. 2-4, 2013, pp. 249-252.

Agah, A. et al., "A 45GHz Doherty Power Amplifier with 23% PAE and 18dBm Output Power, in 45nm SOI CMOS", In Proceedings of IEEE International Microwave Symposium Digest, Montreal, QC, CA, Jun. 17-22, 2012, pp. 1-3.

Avratoglou, C.P. et al., "Analysis and Design of a Generalized Class E Tuned Power Amplifier", In IEEE Transactions on Circuits and Systems, vol. 36, No. 8, Aug. 1989, pp. 1068-1079.

Baek, D. et al., "Analysis on Resonator Coupling and its Application to CMOS Quadrature VCO at 8 GHz", In IEEE Radio Frequency Integrated Circuits Symposium, Jun. 2003, pp. 85-88.

Balteanu, A. et al., "A 2-bit, 24 dBm, Millimeter-Wave SOI MCOS Power-DAC Cell for Watt-Level High-Efficiency, Fully Digital M-ary QAM Transmitters", In IEEE Journal of Solid-State Circuits, vol. 48, No. 5, May 2013, pp. 1126-1137.

Balteanu, A. et al., "A 45-GHz, 2-bit Power DAC with 24.3 dBm Output Power, >14 Vpp Differential Swing, and 22% Peak PAE in 45-nm SOI CMOS", In Proceedings of IEEE Radio Frequency Integrated Circuits Symposium, Montreal, QC, CA, Jun. 17-19, 2012, pp. 319-322.

Bhat, R. et al., "Large-Scale Power Combining and Mixed-Signal Linearizing Architectures for Watt-Class mmWave CMOS Power Amplifiers", In IEEE Transactions on Microwave Theory and Techniques, vol. 63, No. 2, Jan. 2015, pp. 703-718.

Bhat, R. et al., "Large-Scale Power-Combining and Linearization in Watt-Class mmWave CMOS Power Amplifiers", In Proceedings of IEEE Radio Frequency Integrated Circuits Symposium, Seattle, WA, US, Jun. 2-4, 2013, pp. 283-286.

Bohsali, M. and Niknejad, A.M., "Current Combining 60GHz CMOS Power Amplifiers", In Proceedings of IEEE Radio Frequency Integrated Circuits Symposium, Boston, MA, US, Jun. 7-9, 2009, pp. 31-34.

Chakrabarti, A. and Krishnaswamy, H., "Design Considerations for Stacked Class-E-like mmWave Power DACs in CMOS", In IEEE International Microwave Symposium Digest, Jun. 2-7, 2013, pp. 1-4.

Chakrabarti, A. and Krishnaswamy, H., "High Power, High Efficiency Stacked mmWave Class-E-like Power Amplifiers in 45nm SOI CMOS", In Proceedings of IEEE Custom International Circuits Conference, San Jose, CA, US, Sep. 9-12, 2012, pp. 1-4.

Chakrabarti, A. and Krishnaswamy, H., "High-Power, High-Efficiency, Class-E-like, Stacked mmWave PAs in SOI and Bulk CMOS: Theory and Implementation", In IEEE Transactions on Microwave Theory and Techniques, vol. 62, No. 8, Aug. 2014, pp. 1686-1704.

Chakrabarti, A. and Krishnaswamy, H., "Millimeter-Wave Digital Polar Phased Array Transmitter", Technical Report, Sep. 29, 2014, pp. 1-25.

Chakrabarti, A. and Krishnaswamy, H., "An Improved Analysis and Design Methodology for RF Class-E Power Amplifiers with Finite DC-feed Inductance and Switch On-Resistance", In Proceedings of the IEEE International Symposium on Circuits and Systems (ISCAS '12), Seoul, KR, May 20-23, 2012, pp. 1763-1766.

Chakrabarti, A. et al., "Dual-Output Stacked Class-EE Power Amplifiers in 45nm SOI CMOS for Q-band Applications", In Proceedings of IEEE Compound Semiconductor Integrated Circuit Symposium (CSICS '12), La Jolla, CA, US, Oct. 14-17, 2012, pp. 1-4.

Chakrabarti, A. et al., "Multi-Output Stacked Class-En mmWave Power Amplifiers in 45nm SOI CMOS", In IET Microwaves, Antennas & Propagation, vol. 9, No. 13, Oct. 2015, pp. 1425-1435.

Chen, A. et al., "An 83-GHz High-Gain SiGe BiCMOS Power Amplifier Using Transmission-Line Current-Combining Technique", In IEEE Transactions on Microwave Theory and Techniques, vol. 61, No. 4, Mar. 2013, pp. 1557-1569.

Chen, J. and Niknejad, A., "A Compact 1V 18.6dBm 60GHz Power Amplifier in 65nm CMOS", In Proceedings of the International Solid-State Circuits Conference Digest of Technical Papers (ISSCC '11), San Francisco, CA, US, Feb. 20-24, 2011, pp. 432-433.

Chen, J. et al., "A Digitally Modulated mm-Wave Cartesian Beamforming Transmitter with Quadrature Spatial Combining", In IEEE International Solid-State Circuits Conference Digest of Technical Papers (ISSCC '13), Feb. 17-21, 2013, pp. 232-233.

Chowdhury, D. et al., "A Fully Integrated Dual-Mode Highly Linear 2.4GHz CMOS Power Amplifier for 4G WiMax Applications", In IEEE Journal of Solid-State Circuits, vol. 44, No. 12, Dec. 2009, pp. 3393-3402.

Chowdhury, D. et al., "A Fully-Integrated Efficient CMOS Inverse Class-D Power Amplifier for Digital Polar Transmitters", In the IEEE Journal of Solid-State Circuits, vol. 47, No. 5, May 2012, pp. 1113-1122.

Colomb, F. and Platzker, A., "A 3-Watt Q-band GaAs pHEMT Power Amplifier MMIC for High Temperature Operation", In IEEE International Microwave Symposium Digest, Jun. 2006, pp. 897-900.

(56) References Cited

OTHER PUBLICATIONS

Dabag, H. et al., "Analysis and Design of Stacked-FET Millimeter-Wave Power Amplifiers", In IEEE Transactions on Microwave Theory and Techniques, vol. 61, No. 4, Mar. 2013, pp. 1543-1556.
Datta, K. and Hashemi, H., "A 22.4 dBm Two-Way Wilkinson Power-Combined Q-Band SiGe Class-E Power Amplifier with 23% Peak PAE", In IEEE Compound Semiconductor Integrated Circuit Symposium, Oct. 14-17, 2012, pp. 1-4.
Datta, K. et al., "Analysis, Design and Implementation of mm-Wave SiGe Stacked Class-E Power Amplifiers", In IEEE Radio Frequency Integrated Circuits Symposium, Jun. 2-4, 2012, pp. 275-278.
Dickson, T. et al., "The Invariance of Characteristic Current Densities in Nanoscale MOSFETs and its Impact on Algorithmic Design Methodologies and Design Porting of Si(Ge) (Bi)CMOS High-Speed Building Blocks", In IEEE Journal of Solid-State Circuits, vol. 41, No. 8, Aug. 2006, pp. 1830-1845.
Ezzeddine, A. et al., "High-Voltage FET Amplifiers for Satellite and Phased-Array Applications", In IEEE Transactions on Microwave Theory and Techniques, St. Louis, MO, US, Jun. 4-6, 1985, pp. 336-339.
Ezzeddine, A.K. and Huang, H.C., "The High Voltage/High Power FET", In Proceedings of IEEE Radio Frequency Integrated Circuits Symposium, Jun. 8-10, 2003, pp. 215-218.
Fathi, M. et al., "A Stacked 6.5-GHz 29.6-dBm Power Amplifier in Standard 65-nm CMOS", In IEEE Conference on Custom Integrated Circuits (CICC '10), Sep. 19-22, 2010, pp. 1-4.
FCC, "Revision of Part 15 of the Commission's Rules Regarding Operation in the 57-64 GHz Band", Technical Report, Aug. 2013, pp. 1-2, available at: http://hraunfoss.fcc.gov/edocs_public/attachmatch/FCC-13-112A1.pdf.
Frlan, E. et al., "Computer-Aided Design of Square Spiral Transformers and Inductors", In Proceedings of the IEEEE Microwave Theory and Techniques Symposium, Jun. 1989, pp. 661-664.
Gogineni, U. et al., "RF Power Potential of 45 nm CMOS Technology", In Proceedings of the Tropical Meeting on Silicon Monolithic Integrated Circuits in RF Systems (SiRF '10), New Orleans, LA, US, Jan. 11-13, 2010, pp. 204-207.
Haldi, P. et al., "CMOS Compatible Transformer Power Combiner", In Electronics Letters, vol. 42, No. 19, Sep. 2006, pp. 1091-1092.
Haque, U. et al., "Combined RF and Multilevel PWM Switch Mode Power Amplifier", In Proceedings of IEEE NORCHIP, Vilnius, LT, Nov. 11-12, 2013, pp. 1-4.
Hasani, J.Y. and Kamerei, M., "Analysis and Optimum Design of a Class E RF Power Amplifier", In IEEE Transactions on Circuits and Systems (TCAS-1), vol. 55, No. 6, Jul. 2008, pp. 1759-1768.
Heydari, B. et al., "Millimeter-Wave Devices and Circuit Blocks up to 104GHz in 90nm CMOS", In IEEE Journal of Solid-State Circuits, vol. 42, No. 12, Dec. 2007, pp. 2893-2903.
International Preliminary Report on Patentability dated Oct. 17, 2013 in International Patent Application No. PCT/US2012/032218.
International Search Report and Written Opinion dated Jul. 27, 2012 in International Patent Application No. PCT/US2012/032218.
ITU, "Attenuation by Atmospheric Gases", Sep. 2013, pp. 1-24, available at: http://www.itu.int/dms_pubrec/itu-r-rec/p/R-Rec-P.676-10-201309-I!!MSW-E.docs.
ITU, "Recommendation P. 676: Attenuation by Atmospheric Gases", last updated Sep. 2013, pp. 1, available at: https://www.itu.int/rec/R-REC-P.676/en.
Johnson, E., "Physical Limitations on Frequency and Power Parameters of Transistors", In IRE International Convention Record, vol. 13, Mar. 1965, pp. 27-34.
Kalantari, N. and Buckwalter, J.F., "A 19.4dBm, Q-Band Class-E Power Amplifier in a 0.12um SiGe BiCMOS Process", In IEEE Microwave and Wireless Components Letters, vol. 20, No. 5, May 2010, pp. 283-285.
Kee, S., "The Class E/F Family of Harmonic-Tuned Switching Power Amplifiers", Ph.D. Dissertation, Department of Electrical Engineering, California Institute of Technology, Pasadena, CA, US, Dec. 2001, pp. 1-185, available at: http://resolver.caltech.edu/CaltechETD:etd-04262005-152703.
Kee, S.D. et al., "The Class-E/F Family of ZVS Switching Amplifiers", In IEEE Transactions on Microwave Theory and Techniques, vol. 51, No. 6, Jun. 2003, pp. 1677-1690.
Kim, J.G. and Rebeiz, G., "Miniature Four-Way and Two-Way 24 GHz Wilkinson Power Dividers in 0.13 um CMOS", In IEEE Microwave and Wireless Components Letters, vol. 17, No. 9, Sep. 2007, pp. 658-660.
Ko, S. and Lin, J., "A Linearized Cascode CMOS Power Amplifier", In IEEE Wireless and Microwave Technical Conference, Dec. 4-5, 2006, pp. 1-4.
Krishnaswamy, H. and Hashemi, H., "Inductor and Transformer-Based Integrated RF Oscillators: A Comparative Study", In Proceedings of IEEE Custom Integrated Circuits Conference (CICC '06), San Jose, CA, US, Sep. 10-13, 2006, pp. 381-384.
Lai, J. and Valdes-Garcia, V., "A 1V 17.9dBm 60GHz Power Amplifier in Standard 65nm CMOS", In Proceedings of the IEEE International Solid-State Circuits Conference Digest of Technical Papers (ISSCC '10), San Francisco, CA, US, Feb. 7-11, 2010, pp. 424-425.
Law, C.Y. and Pham, A.V., "A High Gain 60Ghz Power Amplifier with 20dBm Output Power in 90nm CMOS", In Proceedings of the IEEE International Solid-State Circuits Conference (ISSCC '10), San Francisco, CA, US, Feb. 7-11, 2010, pp. 426-427.
Lee, O. et al., "A Charging Acceleration Technique for Highly Efficient Cascode Class-E CMOS Power Amplifiers", In the IEEE Journal of Solid-State Circuits, vol. 45, No. 10, Oct. 2010, pp. 2184-2197.
Martineau, B. et al., "A 53-68 GHz 18 dBm Power Amplifier with an 8-Way Combiner in Standard 65 nm CMOS", In IEEE International Solid-Slate Circuits Conference Digest Technical Papers, Feb. 2010, pp. 428-429.
Mazzanti, A. et al., "Analysis of Reliability and Power Efficiency in Cascode Class-E PAs", In IEEE Journal of Solid-Stale Circuits, vol. 41, No. 5, May 2006, pp. 1222-1229.
McRory, J.G. et al., "Transformer Coupled Stacked FET Power Amplifiers", In IEEE Journal of Solid-State Circuits, vol. 34, No. 2, Feb. 1999, pp. 157-161.
Morshed, T.H. et al., "BSIM4.4.7 MOSFET Model User's Manual", Department of Electrical Engineering and Computer Sciences, University of California, Berkeley, 2011, pp. 1-184.
Nicolson, S. et al., "A 1.2 V, 140 GHz Receiver with On-Die Antenna in 65 nm CMOS", In IEEE Radio Frequency Integrated Circuits Symposium, Jun. 2008, pp. 229-232.
Niknejad, A. et al., "Nanoscale CMOS for mm-Wave Applications", In IEEE Compound Semiconductor Integrated Circuits Symposium, Oct. 14-17, 2007, pp. 1-4.
Office Action dated Feb. 9, 2015 in U.S. Appl. No. 14/009,854.
Office Action dated Feb. 16, 2016 in U.S. Appl. No. 14/873,177.
Office Action dated Sep. 11, 2015 in U.S. Appl. No. 14/009,854.
Ogunnika, Q.T. and Valdes-Garcia, A., "A 60GHz Class-E Tuned Power Amplifier with PAE >25% in 32nm SOI CMOS", In Proceedings of IEEE Radio Frequency Integrated Circuits Symposium (RFIC '12), Montreal, QC, CA, Jun. 17-19, 2012, pp. 65-68.
Pfeiffer, U.R. and Goern, D., "A 20 dBm Fully-Integrated 60GHz SiGe Power Amplifier with Automatic Level Control", In IEEE Journal of Solid-Slate Circuits, vol. 42, No. 7, Jul. 2007, pp. 1455-1463.
Pfeiffer, U.R. and Goren, D., "A 23-dBm 60-GHz Distributed Active Transformer in a Silicon Process Technology", In IEEE Transactions on Microwave Theory and Techniques, vol. 55, No. 5, May 2007, pp. 857-865.
Piazzon, L. et al., "New Generation of Multi-Step Doherty Amplifier", In Proceedings of IEEE European Microwave Integrated Circuits Conference, Manchester, UK, Oct. 10-11, 2011, pp. 116-119.
Pornpromlikit, S. et al, "A Watt-Level Stacked-FET Linear Power Amplifier in Silicon-on-Insulator CMOS", In IEEE Transactions on Microwave Theory and Techniques, Dec. 2010, pp. 57-64.
Pornpromlikit, S. et al., "A 33-dBm 1.9-GHz Silicon-on-Insulator CMOS Stacked-FET Power Amplifier", In IEEE Microwave Theory and Techniques Symposium Digest, Jun. 7-12, 2009, pp. 533-536.
Pornpromlikit, S. et al., "A Q-Band Amplifier Implemented with Stacked 45-nm CMOS FETs", In Proceedings of the IEEE Com-

(56) References Cited

OTHER PUBLICATIONS pound Semiconductor Integrated Circuit Symposium (CSICS '11), Waikoloa, HI, US, Oct. 16-19, 2011, pp. 1-4.

Rabjohn, G.G., "Monolithic Microwave Transformers", Masters English Thesis, Carleton University, Ottawa, ON, CA, Apr. 1991, pp. 1-162.

Reynaert, P. and Steyaert, M.S., "A 1.75GHz GSM/EDGE Polar Modulated CMOS RF Power Amplifier", In IEEE Journal of Solid-State Circuits, vol. 40, No. 12, Feb. 2005, pp. 2598-2608.

Sandstrom, D. et al., "94 GHz Power-Combining Power Amplifier with +13dBm Saturated Output Power in 65 nm CMOS", In IEEE Radio Frequency Integrated Circuits Symposium, Jun. 5-7, 2011, pp. 1-4.

Sarkas, I. et al., "A 45nm SOI CMOS Class-D mm-Wave PA with >10Vpp Differential Swing", In Proceedings of IEEE International Solid-State Circuits Conference, San Francisco, CA, US, Feb. 19-23, 2012, pp. 88-89.

Sengupta, K. et al., "On-Chip Sensing and Actuation Methods for Integrated Self-Healing mm-Wave CMOS Power Amplifier", In IEEE International Microwave Symposium, Jun. 17-22, 2012, pp. 1-3.

Sharma, J. and Krishnaswamy, H., "215GHz CMOS Signal Source Based on a Maximum-Gain Ring Oscillator Topology", In Proceedings of the IEEE MTT-S International Microwave Symposium Digest (MTT '12), Montreal, QC, CA, Jun. 17-22, 2012, pp. 1-3.

Shibata, K. et al., "Microstrip Spiral Directional Coupler", In IEEE Transactions on Microwave Theory and Techniques, vol. 29, Jul. 1981, pp. 680-689.

Shifrin, M. et al., "A New Power Amplifier Topology with Series Biasing and Power Combining of Transistors", In IEEE Microwave and Millimeter-Wave Monolithic Circuits Symposium, Jun. 1-3, 1992, pp. 39-41.

Shirinfar, F. et al., "A Fully Integrated 22.6dBm mm-Wave PA in 40nm CMOS", In Proceedings of IEEE Radio Frequency Integrated Circuits Symposium (RFIC), Seattle, WA, US, Jun. 2-4, 2013, pp. 279-282.

Shopov, S. et al., "A 19dBm, 15 Gbaud, 9 bit SOI CMOS Power-DAC Cell for High-Order QAM W-Band Transmitters", In IEEE Journal of Solid-State Circuits, vol. 49, No. 7, Jul. 2014, pp. 1653-1664.

Siligaris, A. et al., "A 60 GHz Power Amplifier with 14.5 dBm Saturation Power and 25% Peak PAE in CMOS 65nm SOI", In IEEE Journal of Solid-State Circuits, vol. 45, No. 7, Jul. 2010, pp. 1286-1294.

Sokal, N.O. and Sokal, A.D., "Class E-A New Class of High-Efficiency Tuned Single-Ended Switching Power Amplifiers", In IEEE Journal of Solid-State Circuits, vol. 10, No. 3, Jun. 1975, pp. 168-176.

Son, K.Y. et al., "A 1.8-GHz CMOS Power Amplifier using Stacked nMOS and pMOS Structures for High-Voltage Operation", In IEEE Transaction on Microwave Theory and Techniques, Oct. 2009, pp. 2652-2660.

Soyeur, M. et al., "Multilevel Monolithic Inductors in Silicon Technology", In Electronics Letters, vol. 31, No. 5, Mar. 1995, pp. 359-360.

Straayar, M. et al., "A Low-Noise Transformer-Based 1.7 GHz CMOS VCO", In International Solid-State Circuits Conference Digest of Technical Papers, vol. 1, Feb. 2002, pp. 286-287.

Tai, W. et al., "A 0.7W Fully Integrated 42GHz Power Amplifier with 10% PAE in 0.13m SiGe BiCOMS", In Proceedings of IEEE International Solid-State Circuits Conference, San Francisco, CA, US, Feb. 17-21, 2013, pp. 142-144.

Tsai, K.C. "CMOS Power Amplifiers for Wireless Communicaitons", Ph.D. Dissertation, California Institute of Technology, La Jolla, San Diego, CA, US, Dec. 2007, pp. 1-250.

U.S. Appl. No. 14/639,700, filed Mar. 5, 2015.
U.S. Appl. No. 14/873,177, filed Oct. 1, 2015.
U.S. Appl. No. 61/948,198, filed Mar. 5, 2014.
U.S. Appl. No. 62/058,603, filed Oct. 1, 2014.

Wang, C. et al., "Improved Design Technique of a Microwave Class-E Power Amplifier with Finite Switching-On Resistance", In Proceedings of the IEEE Radio and Wireless Conference (RAWCON '02), Boston, MA, US, Aug. 11-14, 2002, pp. 241-244.

Wang, C., "CMOS Power Amplifiers for Wireless Communicaitons", Ph.D. Dissertation, California Institute of Technology, La Jolla, San Diego, CA, US, 2003, pp. 1-159.

Wang, H. et al., "Data Rale and Spectrum Requirements for IEEE 802.11 aj (45 GHz)", Sep. 27, 2012, pp. 1-19, available at: https://mentor.ieee.org/802.11/documents/.

Wang, H. et al., "MM-Wave Integration and Combinations", In IEEE Microwave Magazine, vol. 13, No. 5, Jul./Aug. 2012, pp. 49-57.

Wang, K. et al., "A 1V 19.3 dBm 79 GHz Power Amplifier in 65 nm CMOS", In IEEE International Solid-Stale Circuits Conference Digest of Technical Papers (ISSCC '12), San Francisco, CA, US, Feb. 19-23, 2012, pp. 260-262.

Wicks, B. et al., "A 60-GHz Fully-Integrated Doherty Power Amplifier Based on 0.13 µm CMOS Process", In Proceedings of IEEE Radio Frequency Integrated Circuits Symposium, Atlanta, GA, US, Jun. 15-17, 2008, pp. 69-72.

Wikipedia, "Microwave", last modified Mar. 25, 2016, pp. 1-11, available at: http://en.wikipedia.org/wiki/Microwave#Uses.

Xing, W. et al., "11aj 45GHz Link Budget for Use Cases Discussion", last updated Nov. 2012, pp. 1-10, available at: https://mentor.ieee.org/802.11/dcn/12/.

Xu, H. et al., "A Highly Linear 25 dBm Outphasing Power Amplifier in 32 nm CMOS for WLAN Application", In Proceedings of the 2010 European Solid-State Circuits Conference (ESSCIRC '10), Sevilla, ES, Sep. 14-16, 2010, pp. 306-309.

Yang, W. et al., "BSIMS0Iv4.4 MOSFET Model User's Manual", BSIM Group, Department of Electrical Engineering and Computer Sciences, University of California, Berkeley, Dec. 2010, pp. 1-128.

Yue, C.P. and Wong, S.S., "On-Chip Spiral Inductors with Patterned Ground Shields for Si-Based RF ICs", In IEEE Journal of Solid-State Circuits, vol. 33, No. 5, May 1998, pp. 743-752.

Zhao, D. and Reynaert, P., "14.1 A 0.9 V 20.9 dBm 22.3%-PAE E-Band Power Amplifier with Broadband Parallel-Series Power Combiner in 40 nm CMOS", In IEEE International Solid-State Circuits Conference Digest Technical Papers, Feb. 2014, pp. 248-249.

Zhao, D. et al., "A 60 GHz Dual-Mode Power Amplifier with 17.4 dBm Output Power and 29.3% PAE in 40-nm CMOS", In Proceedings of IEEE European Solid-Slate Circuit Conference, Bodeaux, FR, Sep. 17-21, 2012, pp. 337-340.

Zhao, D. et al., "A 60GHz Outphasing Transmitter in 40nm CMOS with 15.6dBm Output Power", In Proceedings of IEEE International Solid-State Circuits Conference, San Francisco, CA, US, Feb. 19-23, 2012, pp. 170-172.

Zhao, Y. et al., "Compact Transformer Power Combiners for Millimeter-Wave Wireless Applications", In Proceedings of IEEE Radio Frequency Integrated Circuits Symposium, Anaheim, CA, US, May 23-25, 2010, pp. 223-226.

Notice of Allowance dated Oct. 5, 2016 in U.S. Appl. No. 14/873,177.
Notice of Allowance dated Apr. 24, 2018 in U.S. Appl. No. 14/639,700.
Office Action dated Nov. 2, 2017 in U.S. Appl. No. 14/639,700.
Hasani et al., "Transmission line Inductor Modeling and Design for Millimeter Wave Circuits in Digital CMOS Process," IEEE International Workshop on Radio-Frequency Integration Technology, Rasa Sentosa Resort, Dec. 2007, pp. 290-293.
Notice of Allowance dated Apr. 1, 2016 in U.S. Appl. No. 14/009,854.
Office Action dated Jun. 14, 2018 in U.S. Appl. No. 15/401,547.
Wagh, Poojan. "The Binary Number System—Part 2: Binary Weighting." Circuit Design, Jun. 30, 2008, www.circuitdesign.info/blog/2008/06/the-binary-number-system-part-2-binary-weighting/.

* cited by examiner

CIRCUITS FOR PROVIDING CLASS-E POWER AMPLIFIERS

CROSS REFERENCE TO RELATED APPLICATIONS

This application is a continuation of U.S. patent application Ser. No. 14/009,854, filed Oct. 4, 2013, which is a national stage application under 35 U.S.C. § 371 of International Application No. PCT/US2012/032218, filed Apr. 4, 2012, which claims the benefit of U.S. Provisional Patent Application No. 61/620,361, filed Apr. 4, 2012, and U.S. Provisional Patent Application No. 61/471,645, filed Apr. 4, 2011, each of which is hereby incorporated by reference herein in its entirety.

STATEMENT REGARDING FEDERALLY FUNDED RESEARCH

This invention was made with government support under Grant No. FA8650-10-1-7042 awarded by DARPA MTO. The government has certain rights in the invention.

TECHNICAL FIELD

The disclosed subject matter relates to circuits for providing Class-E power amplifiers.

BACKGROUND

The Class-E family of switching Power Amplifiers (PAs) finds favor in applications requiring efficiency. In a conventional, single-transistor, Class-E PA, ideally 100% efficiency is achieved (in the absence of device and passive component losses) through the achievement of "Class-E switching conditions." "Class-E switching conditions" refers to the phenomena of Zero Voltage at Switching (ZVS) and Zero Derivative of Voltage at Switching (ZDVS) of the output node voltage. For conventional, single-transistor Class-E PAs, these conditions can be achieved by placing a "Class-E output network" (which can include a parallel combination of an inductor to a supply voltage and a tuned load network) at the output node.

In a particular technology (e.g., CMOS, SiGe, etc.), the output power that can be obtained from a Class-E PA employing a single transistor can be limited by the breakdown voltage of that technology. Thus, a common practice to boost the output power is to stack two or more transistors, thus doubling the breakdown voltage at the final output node. In a stacked configuration, while all stacked devices may be explicitly driven, it is also possible to drive only the bottom-most device and allow the output swing of each device to turn on/off the device above it, thus reducing input power and enhancing efficiency. The main challenge in stacking multiple devices is to retain the Class-E-like behavior for all the stacked devices. Deviation from Class-E behavior leads to degradation in performance in terms of output power and efficiency. Typically, to mitigate this issue (with two stacked devices), an inductor is connected from the intermediate terminal of the stacked devices through a DC-blocking capacitor to ground, or a feed-forward capacitor is connected from the output node of the top device to the intermediate terminal of the stacked devices. However, these techniques are only partially successful in achieving Class-E behavior of both/all devices, even in an ideal situation when there are no losses in the circuit.

Accordingly, new circuits for providing Class-E power amplifiers are desired.

SUMMARY

Circuits for providing Class-E power amplifiers are provided. In some embodiments, circuits for providing Class-E power amplifiers are provided, the circuits comprising: a first switch having a first side and a second side; a first Class-E load network coupled to the first side of the first switch; a second Class-E load network; and a second switch having a first side and a second side, the first side of the second switch being coupled the second side of the first switch and the second Class-E load network.

DETAILED DESCRIPTION

Circuits for providing Class-E power amplifiers are provided.

In accordance with some embodiments, circuits for providing Class-E power amplifiers that employ stacked switching devices, each having a Class-E load network, are provided. In some embodiments, a "Class-E load network" (which can include a DC-feed inductor to a power supply in parallel with a series resonant filter connected to a Class-E load impedance) is connected at the drain node of each stacked device. The resulting topology can result in a stacking of two (or more) single-device Class-E PAs that each retain individual Class-E characteristics. In some embodiments, output power can be derived from the intermediary node(s) in addition to the drain of the top stacked device.

Figure 1:
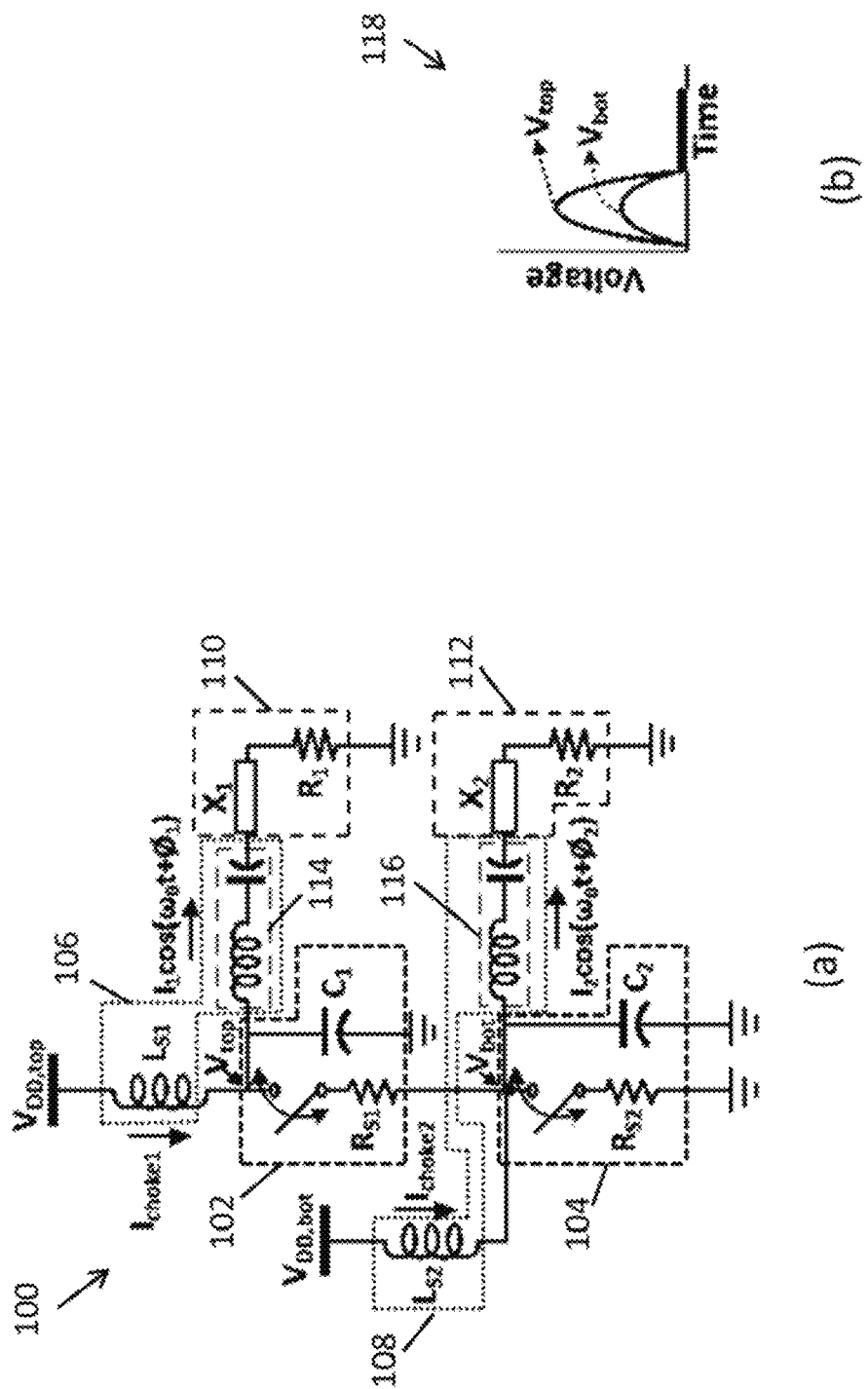
FIG. 1 is a drawing of a topology for a circuit for a Class-E power amplifier in accordance with some embodiments.

FIG. 1a illustrates an example of a topology 100 for a Class-E amplifier that can be used in accordance with some embodiments.

As shown, topology 100 can include two stacked switching devices 102 and 104, two Class-E load networks 106 and 108, and two Class-E load impedances 110 and 112.

Devices 102 and 104 can be any suitable switching devices. For example, in some embodiments, switching devices 102 and 104 can be MOSFETs, BJTs, and/or any other suitable switching devices in some embodiments.

Switching devices 102 and 104 can be represented by switches $S_1$ and $S_2$ with output capacitances $C_1$ and $C_2$ and "ON" resistances $R_{s1}$ and $R_{s2}$, respectively. Each of switches 102 and 104 can be driven by a square wave input with 50% duty-cycle (not shown), sine wave, and/or any other suitable input signal. In this representation, the output capacitance $C_1$ consists of the $C_{gd}$ (gate to drain capacitance) and $C_{db}$ (drain to bulk capacitance) of the top device, and the output capacitance $C_2$ consists of the $C_{gs}$ (gate to source capacitance) and $C_{sb}$ (source to bulk capacitance) of the top device, and $C_{gd}$ and $C_{db}$ of the bottom device.

Because each switch has a "Class-E load network" of its own and because each switch has an equal duty cycle, each switch can exhibit independent Class-E-like behavior and Class-E design equations can apply directly to each switch 102 and 104 and its load network 106 and 108, respectively. Thus, the switches can be sized to drive independent load impedances 110 and 112.

As described above and as shown in FIG. 1a, load network 106 can include a DC-feed inductor $L_{S1}$ connected between a power supply $V_{DD,top}$ and the drain node of switch device 102 and a series resonant filter 114 connected between Class-E load impedance 110 and the drain node of switch device 102. Load network 108 can include a DC-feed inductor $L_{S2}$ connected between a power supply $V_{DD,bot}$ and the drain node of switch device 104 and a series resonant filter 116 connected between Class-E load impedance 112 and the drain node of switch device 104.

Class-E load impedances 110 and 112 can be any suitable Class-E load impedances. As shown in FIG. 1a, these impedances can be represented by a transmission line $X_1$ and $X_2$ and a resistance $R_1$ and $R_2$, respectively.

In some embodiments, $V_{DD;bot}$ can be chosen so that the maximum instantaneous drain-source voltage swing for the bottom device is twice the nominal supply voltage. $V_{DD;top}$ can be adjusted so that drain-source voltage swings for top and bottom devices are similar in some embodiments.

Figure 2:
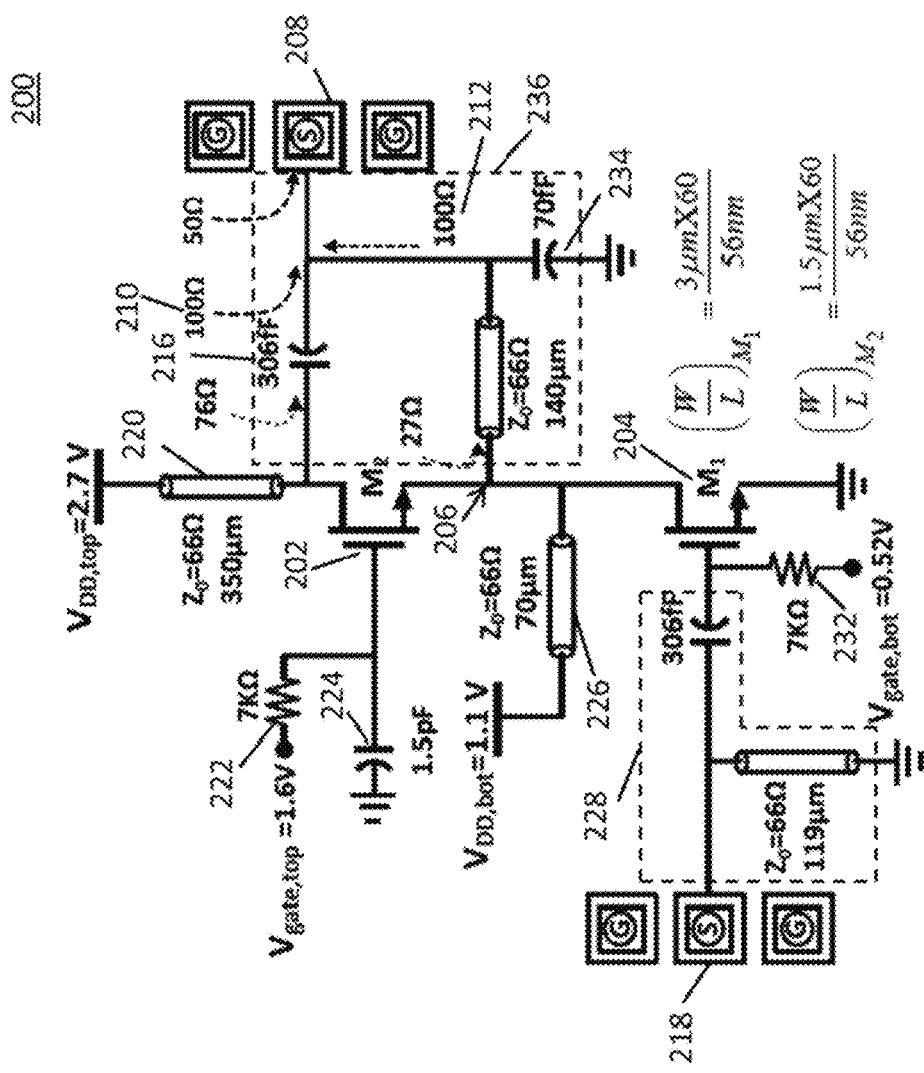
FIG. 2 is a drawing of a circuit for a Class-E power amplifier in accordance with some embodiments.

An example of a circuit 200 consistent with topology 100 in accordance with some embodiments is shown in FIG. 2. As illustrated, circuit 200 includes MOSFET switches 202 and 204 in place of switching devices 102 and 104, respectively, of FIG. 1a. Circuit 200 also includes transmission lines 220 and 226 in place of DC-feed inductors $L_{S1}$ and $L_{S2}$, respectively, of FIG. 1a, and impedance transformation network 236 in place of series resonant filters 114 and 116, respectively, of FIG. 1a. Finally, circuit 200 includes switch gate bias resistors 222 and 232, a bypass capacitor 224, and input impedance transformation network 228 (which includes a transmission line and a capacitor as shown).

As shown, circuit 200 can receive an input signal at input pad 218. Any suitable input signal can be used to drive circuit 200 in some embodiments. For example, in some embodiments, circuit 200 can be driven be a sinusoidal source at input 218. Input impedance transformation network 228 can provide impedance matching so that input 218 matches the impedance of the input signal source. The resulting signal from network 228 can then be biased by resistor 232 and provided to the gate of switch 204.

Similarly, the gate of switch 202 can be DC biased by resistor 222 and AC coupled to ground by bypass capacitor 224.

In some embodiments, in order to utilize the power available from intermediary node 206 as well as the power from the drain of switch 202, the load currents of switches 202 and 204 can be power combined. Power combining can be performed in any suitable manner. For example, as shown in FIG. 2, power combining can be performed by combining the outputs from switches 202 and 204 using impedance transformation network 236.

In some embodiments, to design an impedance transformation network 236 as shown in FIG. 2, load impedances for each switching device 202 and 204 can first be determined, and then a suitable impedance transformation network to convert the load impedances to the desired power amplifier output impedance can be calculated. For example, as shown, the load impedance for device 202 can be determined to be 76 ohms and the load impedance for device 204 can be determined to be 27 ohms. This determination can be made in any suitable manner. For example, in some embodiments, for each switching device, the following equations can be solved by sweeping the output currents and phases for specified operating conditions using any suitable mechanism, such as MATLAB:

$$\frac{dV_{S,ON}}{dt} + \left(\frac{R_{on}}{L}\right)V_{S,ON} - i_0\omega_0 R_{on}\sin(\omega_0 t + \phi) - \left(\frac{V_{DD}R_{on}}{L}\right) = 0.$$

$$\frac{d^2V_{S,OFF}}{dt^2} + \frac{V_{S,OFF}}{LC_{out}} - \frac{i_0\omega_0}{C_{out}}\sin(\omega_0 t + \phi) - \frac{VDD}{LC_{out}} = 0$$

$$P_{loss,cap} = 0.5 f_0 C_{out}\left[V_{S,OFF}^2\left(\frac{T^-}{2}\right) - V_{S,ON}^2\left(\frac{T^+}{2}\right)\right]$$

$$P_{loss,switch} = R_{on} * \frac{1}{T}\int_{\frac{T}{2}}^{T}\left(\frac{V_{S,ON}}{R_{on}}\right)^2 dt$$

$$P_{in} = kf_0 C_{in}V_{on}^2$$

$$P_{loss,choke} = R_{choke} * \frac{1}{T}\left(\int_0^{\frac{T}{2}} i_{L,OFF}^2 dt + \int_{\frac{T}{2}}^{T} i_{L,ON}^2 dt\right)$$

wherein:

$C_{in}$ is the input capacitance the switch;
$C_{out}$ is the output capacitance of the switch;
$f_0$ is the operating frequency;
$i_{L,OFF}$ is the current through the choke (here, transmission line 220 or 226) when the switch is not conducting;
$i_{L,ON}$ is the current through the choke when the switch is conducting;
k is a constant of proportionality;
L is the inductance of the choke;
$p_{in}$ is the input power expended for switching;
$P_{loss,cap}$ is the power loss in the output capacitance of the switch;
$P_{loss,choke}$ is the power loss in the choke;
$P_{loss,switch}$ is the switch power loss in the switch when it is conducting;
$R_{choke}$ is the resistance of the choke;
$R_{on}$ is the on resistance of switch when conducting;
T is the period of operation;
$V_{on}$ is the amplitude of the input signal;
$V_{S,ON}$ is the voltage across switch when conducting;
$V_{S,OFF}$ is the voltage across switch when not conducting; and
$\omega_0$ is the operating frequency in radians.

In some embodiments, because the power combined output at output pad 208 may be required to drive a 50 ohm load (not shown) (e.g., when driving a 50 ohm impedance antenna, test equipment, etc.), the load resistances for each of switches 202 and 204 can be selected so that their parallel combination is 50 ohms. For example, as illustrated in FIG. 2, load resistances 210 and 212 can each be 100 ohms, making the parallel combination 50 ohms.

In some embodiments, the load resistances seen at output pad 208 for the top and the bottom switches 202 and 204 can additionally or alternatively be chosen to be equal (e.g., each 100 ohms) so that the top and bottom switches 202 and 204 deliver equal output power.

In some embodiments, the load voltages for the top and bottom switches 202 and 204 can be selected to be identical or similar in swing and phase as shown in FIG. 1b to minimize cancellation during current-combining. As also shown in FIG. 1b, the drain voltage swing of the top device can be twice that of the bottom device in some embodiments.

Figure 3:
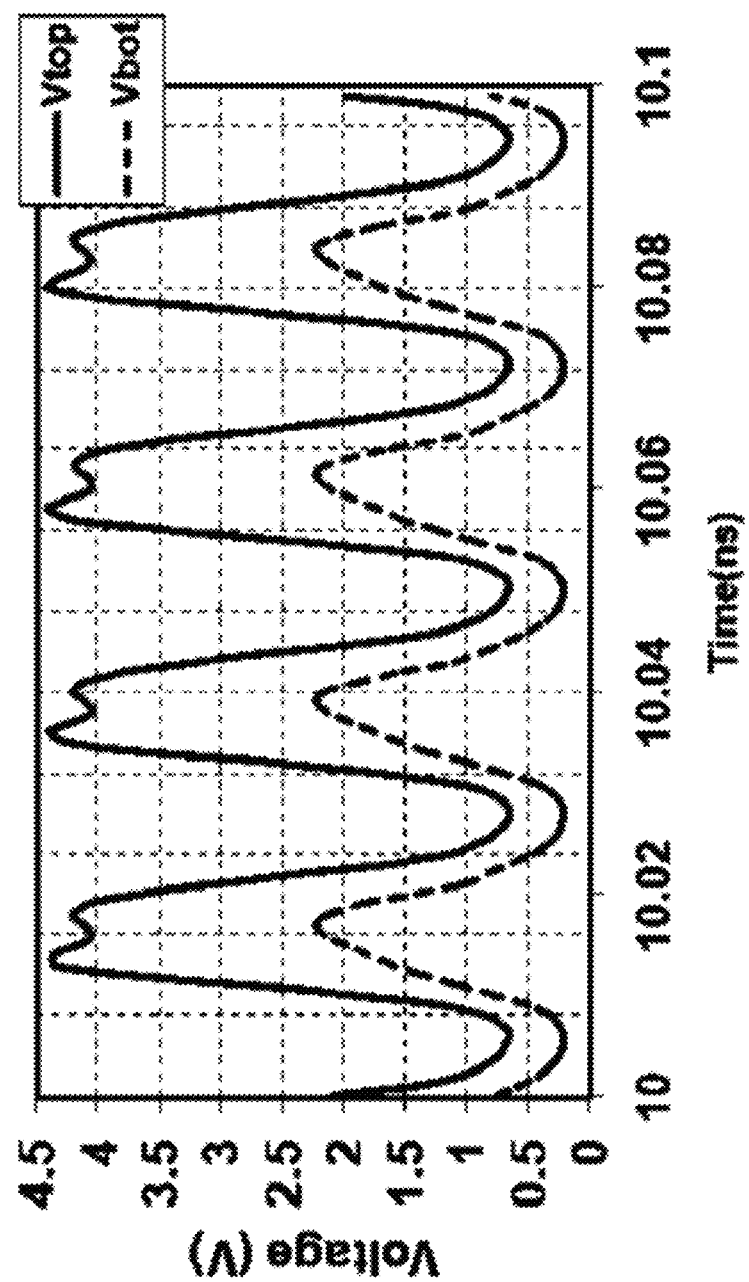
FIG. 3 is a graph of switching device drain voltages in a circuit for a Class-E power amplifier in accordance with some embodiments.

Another example of waveforms $V_{top}$ and $V_{bot}$ that can be produced at the drains of switches 202 and 204, respectively, in response to a sinusoidal input signal in accordance with some embodiments is shown in FIG. 3.

Figure 4:
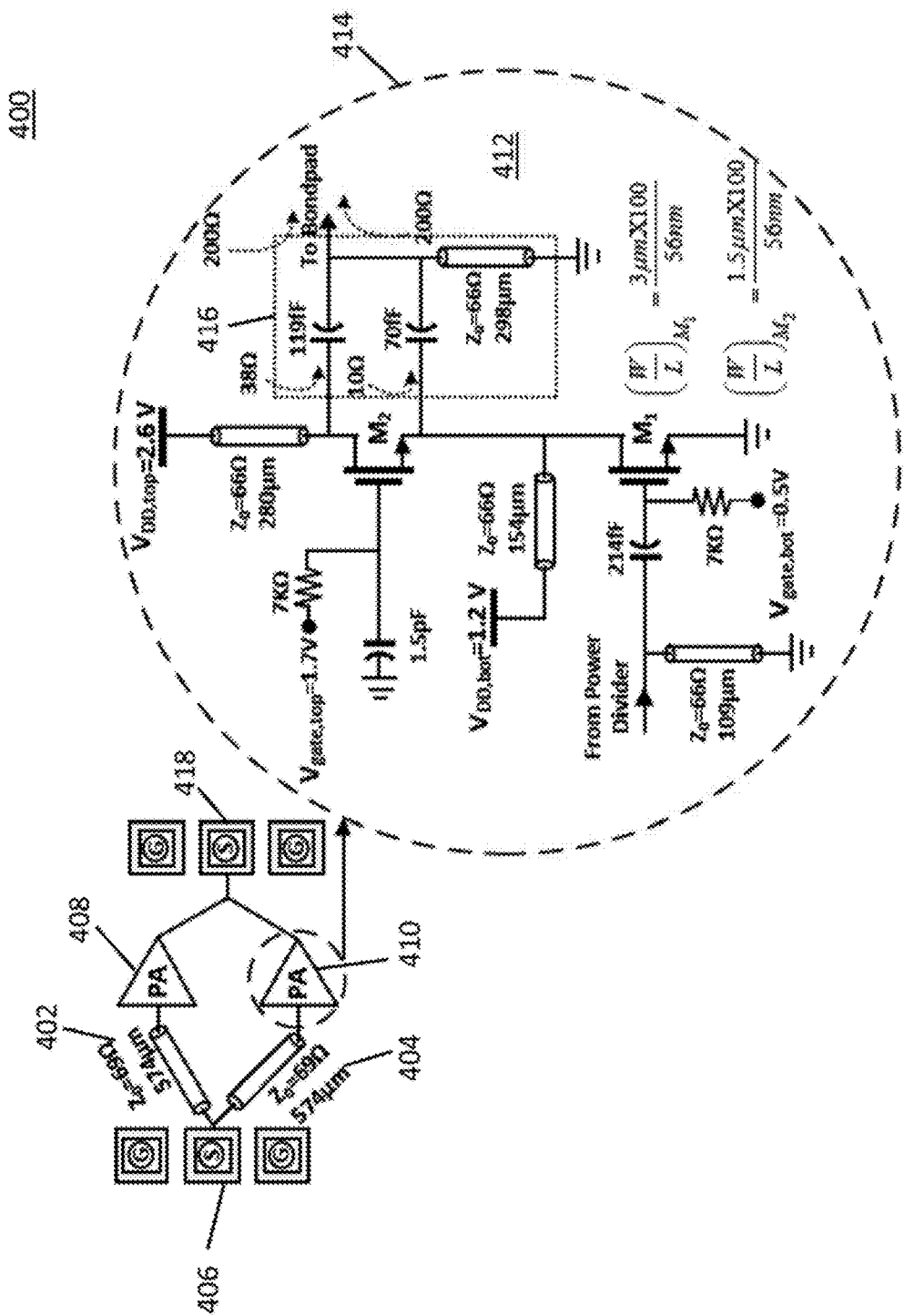
FIG. 4 is a drawing of another circuit for a Class-E power amplifier in accordance with some embodiments.

In some embodiments, two such Class-E power amplifier unit cells, as shown in FIG. 2, can be current-combined, as shown in FIG. 4.

As illustrated in FIG. 4, two quarter-wave transmission lines 402 and 404 can be used to equally split the input power from an input pad 406 to two Class-E amplifiers 408 and 410 in some embodiments. Each of amplifiers 408 and 410 can be implemented in any suitable manner, such as shown by circuit 412 in area 414. As shown, circuit 412 is similar to circuit 200 except that impedance transformation network 416 is implemented differently than impedance transformation network 236.

As described above in connection with FIG. 2, the output impedance at output pad 418 can be configured to match the impedance (e.g., 50 ohm) of any suitable load (e.g., an antenna, test equipment, etc.) connected thereto. Because there are four transistors driving output pad 418, the output impedance of each can be transformed to be 200 ohms so that the parallel combination of these impedances is 50 ohms in some embodiments.

In some embodiments, the DC-feed inductances and the transmission lines in the impedance matching networks can be implemented using Coplanar Waveguides (CPWs) with continuous ground plane. As shown in FIGS. 2 and 4, the transmission lines can have the lengths specified (e.g., 350 µm for transmission line 220 of FIG. 2) and the impedances specified (e.g., 66 ohms for transmission line 220 of FIG. 2), or any other suitable values. Vertical Natural Capacitors (VNCAPs) can be utilized for the capacitors in the circuits in some embodiments.

In some embodiments, such CPWs can have a measured quality factor of ≈15-18 in the Q-band, and the measured quality factor of a W=7.3 µm×L=8 µm 70 fF VNCAP and a W=19 µm×L=9 µm 214 fF VNCAP can be 13 and 7, respectively, at 45 GHz.

Figure 5:
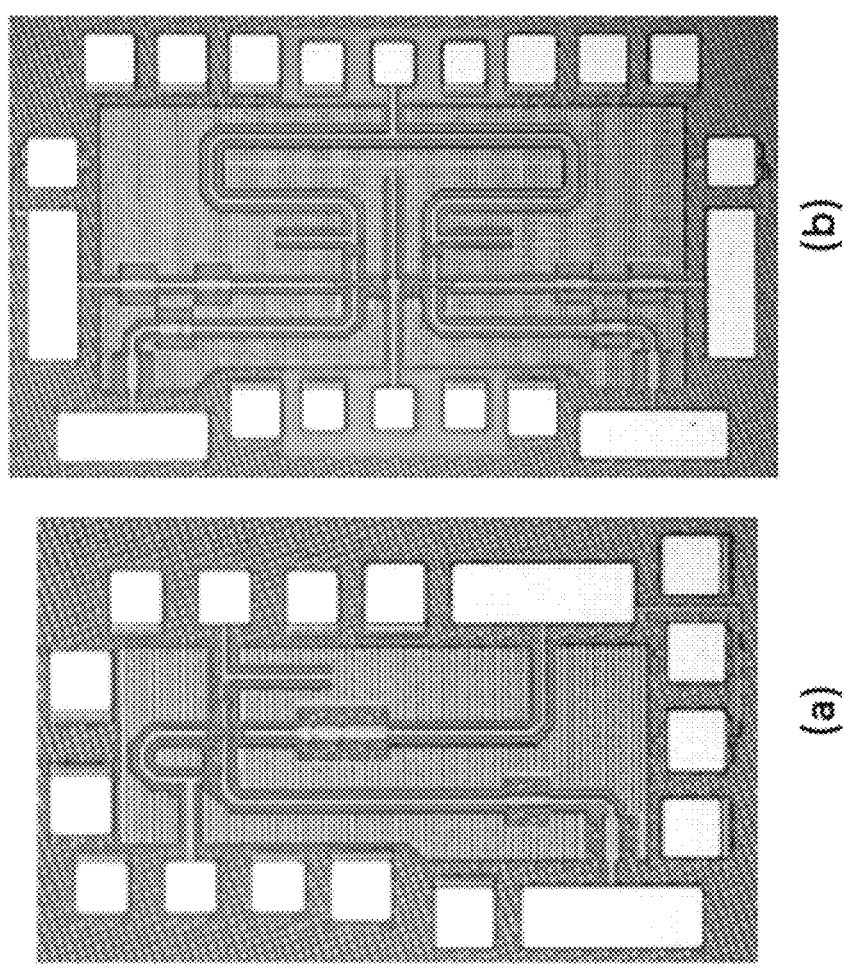
FIG. 5 shows chip microphotographs of two Class-E power amplifiers like those shown in FIGS. 2 and 4 in accordance with some embodiments.

In some embodiments, Class-E power amplifiers as described herein can be fabricated in IBM's 45 nm SOI CMOS technology using 56-nm body-contacted N-type Metal-Oxide-Semiconductor (NMOS) devices stacked as described above. Chip microphotographs of two such Class-E power amplifiers like those shown in FIGS. 2 and 4, respectively, are shown in FIGS. 5(a) and 5(b). These Class-E power amplifiers can occupy 0.8 mm×0.6 mm and 1.06 mm×0.6 mm of die area, respectively, in some embodiments. The operating frequency of these amplifiers can be 45 GHz or any other suitable frequency in some embodiments.

More particularly, for example, in some embodiments, the top switch 202 in FIG. 2 can have a channel length of 56 nm and 60 fingers (each with a width of 1.5 µm), while the bottom switch 204 in FIG. 2 can have a channel length of 56 nm and 60 fingers (each of width 3 µm).

As another more particular example, the top switch in FIG. 4 can have a channel length of 56 nm and 100 fingers (each with a width of 1.5 µm), while the bottom switch in FIG. 4 can have a channel length of 56 nm and 100 fingers (each of width 3 µm).

In some embodiments, with IBM's 45 nm SOI CMOS technology, the 2.225 µm thick topmost metal layer (LB) can constitute a signal conductor while the three lowermost metal layers (M1-M3) can be used for a ground plane.

In some embodiments, usage of 40 nm floating-body devices and splitting the overall device into several smaller devices wired appropriately in parallel can be used to improve the $f_{max}$, and hence the gain available from the device.

In some embodiments, power amplifiers as described herein can be used in any suitable application. For example, in some embodiments, these power amplifiers can be used in applications that involve the use of efficient, high-power wireless transmitters. More particularly, for example, potential applications can include handset and base-station power amplifiers for cellular telephony, transmitters for wireless LAN, Bluetooth and other radio-frequency wireless applications, millimeter-wave vehicular radar currently being explored and deployed in the 22-29 GHz and 77 GHz frequency ranges, and transmitters for 60 GHz wireless personal area networks (WPANs).

Although the invention has been described and illustrated in the foregoing illustrative embodiments, it is understood that the present disclosure has been made only by way of example, and that numerous changes in the details of implementation of the invention can be made without departing from the spirit and scope of the invention, which is limited only by the claims that follow. Features of the disclosed embodiments can be combined and rearranged in various ways.

What is claimed is:

1. A circuit for forming an amplifier comprising:
   a first switch having a first side and a second side;
   one of a first inductor and a first transmission line, the one of the first inductor and the transmission line having a first side connected to the first side of the first switch and having a second side connected to a non-ground power supply voltage;
   one of a second inductor and a second transmission line, the one of the second inductor and the second transmission line having a first side and a second side, the second side of the one of the second inductor and the second transmission line connected to a non-ground power supply voltage; and
   a second switch having a first side and a second side, the first side of the second switch being directly connected to the second side of the first switch and the first side of the one of the second inductor and the second transmission line.

2. The circuit of claim 1, wherein the one of the first inductor and the first transmission line is the first inductor and the first inductor is a choke.

3. The circuit of claim 1, further comprising a first resonant filter having a first side and a second side, the first side of the resonant filter being coupled to a load and the second side of the resonant filter being coupled to the first side of the first switch.

4. The circuit of claim 3, wherein the first resonant filter includes an inductor and a capacitor.

5. The circuit of claim 1, wherein the one of the second inductor and the second transmission line is the second inductor and the second inductor is a choke.

6. The circuit of claim 1, further comprising a second resonant filter having a first side and a second side, the first side of the second resonant filter being coupled to a load and the second side of the second resonant filter being coupled to the first side of the second switch.

7. The circuit of claim 6, wherein the second resonant filter includes an inductor and a capacitor.

8. The circuit of claim 1, wherein each of the first switch and the second switch include a field effect transistor, and wherein the first side and the second side of each of the first switch and the second switch correspond to a source and a drain of the field effect transistor.

9. The circuit of claim 1, further comprising an impedance transformation network coupled to the first side of the first switch.

10. The circuit of claim 9, wherein the impedance transformation network is also coupled to the first side of the second switch.

11. The circuit of claim 9, wherein the impedance transformation network includes a first capacitor, a second capacitor, and a transmission line.

12. The circuit of claim 1, wherein the second switch includes a control input coupled to an input signal.

13. The circuit of claim 12, wherein the control input of the second switch is a gate of a field effect transistor.

14. The circuit of claim 12, wherein the control input is coupled to the input signal by an impedance transformation network.

15. The circuit of claim 14, wherein the impedance transformation network includes a transmission line and a capacitor.

16. The circuit of claim 1, further comprising:
a third switch having a first side and a second side;
a first Class-E load network coupled to the first side of the third switch;
a second Class-E load network; and
a fourth switch having a first side and a second side, the first side of the fourth switch being coupled to the second side of the third switch and the second Class-E load network.

17. The circuit of claim 16, further comprising:
a first transmission line having a first side and a second side, wherein the first side is coupled to an input signal and the second side is coupled to a control input of at least one of the first switch and the second switch; and
a second transmission line having a first side and a second side, wherein the first side is coupled to the input signal and the second side is coupled to a control input of at least one of the third switch and the fourth switch.

* * * * *